(12) United States Patent
Yamaguchi

(10) Patent No.: US 7,393,619 B2
(45) Date of Patent: Jul. 1, 2008

(54) METHOD AND LITHOGRAPHIC STRUCTURE FOR MEASURING LENGTHS OF LINES AND SPACES

(76) Inventor: Yuji Yamaguchi, 5322 Medical Dr., #3-208, San Antonio, TX (US) 78240

(*) Notice: Subject to any disclaimer, the term of this patent is extended or adjusted under 35 U.S.C. 154(b) by 786 days.

(21) Appl. No.: 10/840,922

(22) Filed: May 7, 2004

(65) Prior Publication Data

US 2005/0250025 A1 Nov. 10, 2005

Related U.S. Application Data

(60) Provisional application No. 60/468,893, filed on May 8, 2003.

(51) Int. Cl.
*G03F 9/00* (2006.01)
(52) U.S. Cl. .............. 430/30; 257/48; 257/797; 382/53; 382/77
(58) Field of Classification Search ............. 430/22, 430/30; 257/48, 797; 356/399–401; 382/149, 382/151; 355/53, 77
See application file for complete search history.

(56) References Cited

U.S. PATENT DOCUMENTS 6,778,275 B2* 8/2004 Bowes .................. 356/400
2003/0156276 A1* 8/2003 Bowes .................. 356/124

* cited by examiner

*Primary Examiner*—Christopher G. Young
(74) *Attorney, Agent, or Firm*—Peter Zawilski

(57) ABSTRACT

There is a structure and method for measuring the lengths of lines and spaces in semiconductor process. In an example embodiment, a lithographic structure (400) comprises, a frame (450). The frame includes a top inside edge, a top outside edge, a bottom inside edge, a bottom outside edge, a left inside edge, a left outside edge, a right inside edge, and a right outside edge. There is a first array of lines (430) and spaces, the first array having end of lines (420*b*) and end of spaces (430*a*). The lines have a first line width and the spaces have a first space width; the end of spaces are at a first distance (10) from the top outside edge of the frame (450), the end of lines are at a second distance (20) from the top outside edge of the frame (450). A first opening (410*a*) is a third distance (30) from the bottom outside edge of the frame and a second opening (410*b*) is a fourth distance (40) from the bottom outside edge of the frame.

19 Claims, 7 Drawing Sheets

METHOD AND LITHOGRAPHIC STRUCTURE FOR MEASURING LENGTHS OF LINES AND SPACES

RELATED APPLICATION

This application claims priority to the U.S. Provisional Application (Application No. 60/468,893) filed on May 8, 2003 of Yuji Yamaguchi, the content of which is incorporated by reference in its entirety.

Furtheremore, this application had been filed concurrently with an application (application Ser. No. 10/841,147) filed on May 7, 2004 now issued U.S. Pat. No. 7,332,255 titled, "Overlay Box Structure for Measuring Process-Induced Line Shortening Effect," of Yuji Yamaguchi and Pierre Leroux, the application is incorporated by reference in its entirety.

FIELD OF THE INVENTION

The invention relates to a semiconductor process. More particularly the invention relates to the measuring of lengths of lines and spaces with lithographic structures.

BACKGROUND

The electronics industry continues to rely upon advances in semiconductor technology to realize higher-function devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices have been manufactured having various applications in numerous disciplines. Such silicon-based semiconductor devices often include metal-oxide-semiconductor (MOS) transistors, such as p-channel MOS (PMOS), n-channel MOS (NMOS) and complementary MOS (CMOS) transistors, bipolar transistors, and BiCMOS transistors.

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

One important step in the manufacturing of such devices is the formation of devices, or portions thereof, using photolithography and etching processes. In photolithography, a wafer substrate is coated with a light-sensitive material called photo-resist. Next, the wafer is exposed to light; the light striking the wafer is passed through a mask plate. This mask plate defines those desired features on which areas of the substrate will be printed. After exposure, the resist-coated wafer substrate is developed. The desired features as defined on the mask are retained on the photo resist-coated substrate. Unexposed areas of resist are washed away with a developer. The wafer having the desired features defined is subjected to etching. Depending upon the production process, the etching may either be a wet etch, in which liquid chemicals are used to remove wafer material or a dry etch, in which wafer material is subjected to a radio frequency (RF) induced plasma.

Often desired features have particular regions in which the final printed and etched regions have to be accurately reproduced over time. These regions are characterized by critical dimensions (CDs). As device geometry approaches the sub-micron realm, wafer fabrication becomes more reliant on maintaining consistent CDs over normal process variations. The active device dimensions as designed and replicated on the photo mask and those actually rendered on the wafer substrate have to be repeatable and controllable. In many situations, the process attempts to maintain the final CDs equal to the masking CDs. However, imperfections in the process or changes in technology (that may be realized in a given fabrication process, if the process were "tweaked") often necessitate the rendering of final CDs that deviate from the masking CDs.

U.S. Pat. No. 5,757,507 of Ausschnitt et al. relates generally to manufacturing processes requiring lithography and, more particularly, to monitoring of bias and overlay error in lithographic and etch processes used in microelectronics manufacturing which is particularly useful in monitoring pattern features with dimensions on the order of less than 0.5 micron.

U.S. Pat. No. 5,962,173 of Leroux et al. relates generally to the field of fabricating integrated circuits and more particularly to maintaining accuracy in the fabrication of such circuits having extremely narrow line elements such as gate lines.

U.S. Pat. No. 5,902,703 of Leroux et al. relates generally to the field of fabricating integrated circuits and more particularly to maintaining accuracy in the fabrication of such circuits having relatively narrow line elements such as gate lines. The invention is also directed to the verification of stepper lens fabrication quality.

U.S. Pat. No. 5,976,741 of Ziger et al. relates generally to methods of determining illumination exposure dosages and other processing parameters in the field of fabricating integrated circuits. More particularly, the invention concerns methods of processing semiconductor wafers in step and repeat systems.

U.S. Pat. No. 6,301,008 B1 of Ziger et al. relates to semiconductor devices and their manufacture, and more particularly, to arrangements and processes for developing relatively narrow line widths of elements such as gate lines, while maintaining accuracy in their fabrication.

U.S. patent application U.S. 2002/0182516 A1 of Bowes relates generally to metrology of semiconductor manufacturing processes. More particularly, the present invention is a needle comb reticle pattern for simultaneously making critical dimension (CD) measurements of device features and registration measurements of mask overlays relative to semiconductor wafers during processing of semiconductor wafers. This reference and those previously cited are herein incorporated by reference in their entirety.

In gauging the quality of the printing of the CDs in a wafer process, a Scanning Electron Microscope (SEM) is used to measure the lines and space that define CDs. However, the use of a SEM reduces the throughput time in the wafer fabrication

SUMMARY OF THE INVENTION

As CDs of emerging technologies decline, resolution limits of wafer steppers approach their minimums. Nevertheless, providing such CD information for a given generation of wafer steppers that does not adversely affect throughput time resulting in additional cost is highly desirable.

In an example embodiment in accordance with the present invention on a substrate, there is a lithographic structure for measuring dimensions of lines and spaces. The lithographic structure comprises a frame, the frame including a top inside edge, a top outside edge, a bottom inside edge, a bottom outside edge, a left inside edge, a left outside edge, a right inside edge, and a right outside edge. There is a first array of lines and spaces. The first array has end of lines and end of spaces, the lines having a first line width, the spaces having a first space width, the end of spaces at a first distance from the top outside edge of the frame, the end of lines at a second distance from the top outside edge of the frame. A first opening is a third distance from the bottom outside edge of the frame. A second opening is a fourth distance from the bottom outside edge of the frame. A feature of this embodiment is that the frame may comprise a polygon having at least four sides.

In another embodiment according to the present invention, a lithographic structure for measuring dimensions of lines and spaces on a substrate comprises a frame including a top inside edge, a top outside edge, a bottom inside edge, a bottom outside edge, a left inside edge, a left outside edge, a right inside edge, and a right outside edge. There is a first array of lines and spaces, the first array having end of lines and end of spaces, the lines having a first line width, the spaces having a first space width, the end of spaces at a first distance from the top outside edge of the frame, the end of lines at a second distance from the top outside edge of the frame. A first opening having a first width, is a third distance from the bottom outside edge of the frame. A second opening having a second width is a fourth distance from the bottom outside edge of the frame. There is a second array of lines and spaces, the second array having end of lines and end of spaces, the lines having a second line width, the spaces having a second space width, the end of spaces at a fifth distance from the right outside edge of the frame, the end of lines at a sixth distance from the right outside edge of the frame. A third opening, having a third width is a seventh distance from the right outside edge of the frame; and a fourth opening, having a fourth width is an eighth distance from the right outside edge of the frame.

In yet another embodiment according to the present invention, there is a method for measuring the exposure of a photolithographic image on a substrate. The method comprises forming an image on the substrate, the image comprising, a frame, including a top inside edge, a top outside edge, a bottom inside edge, a bottom outside edge, a left inside edge, a left outside edge, a right inside edge, and a right outside edge; a first array of lines and spaces, the first array having ends of lines and ends of spaces, the lines having a first line width, the spaces having a first space width, the ends of spaces at a first distance from the top outside edge of the frame, the ends of lines at a second distance from the top outside edge of the frame; a first opening, the first opening a third distance from the bottom outside edge of the frame; and a second opening, the second opening a fourth distance from the bottom outside edge of the frame. A first distance between the ends of spaces and the top outside edge of the frame is measured. A second distance between the ends of lines and the top outside edge of the frame is measured. Between the bottom outside edge of the frame and the first opening, a third distance is measured. Between the bottom outside edge of the frame and the second opening a fourth distance is measured. The exposure is determined as a function of first distance and the third distance and a function of the second distance and the fourth distance.

In yet another embodiment according to the present invention, there is a method for qualifying a batch of photo resist. The method comprises selecting a batch of photo resist. Lithographic structures at different exposure doses are printed. At each exposure dose, the lengths of lines and spaces are measured. Curves of lengths of lines and spaces versus exposure dose are plotted. Where the curves intersect, the exposure dose is determined. The determined exposure is assigned to the batch of photo resist selected.

The above summaries of the present invention are not intended to represent each disclosed embodiment, or every feature, of the present invention. Other aspects and features of the exemplary embodiments are provided in the figures and the detailed description that follows.

BRIEF DESCRIPTION OF THE DRAWINGS

The invention may be more completely understood in consideration of the following detailed description of various embodiments of the invention in connection with the accompanying drawings, in which.

DETAILED DESCRIPTION

The present invention has been found to be useful in the measuring of CDs on the rendered image in the photo resist applied on a substrate. In wafer fabrication, the user may either be using positive or negative photo resist. Consequently, clear-field or dark-field masks may be used. Typically, when a positive resist is used, features defined in the clear-field portions of the mask remain; the photo resist is polymerized upon exposure to the high energy light in the wafer stepper. The developer does not remove the polymerized photo resist. In other fabrication processes, a negative resist or dark-field masks may be used. The principles outlined in the present invention are applicable to whichever mask and resist type. For example purposes, a positive resist in which features are defined on the clear-field portions of the mask, will be described below.

Figure 1:
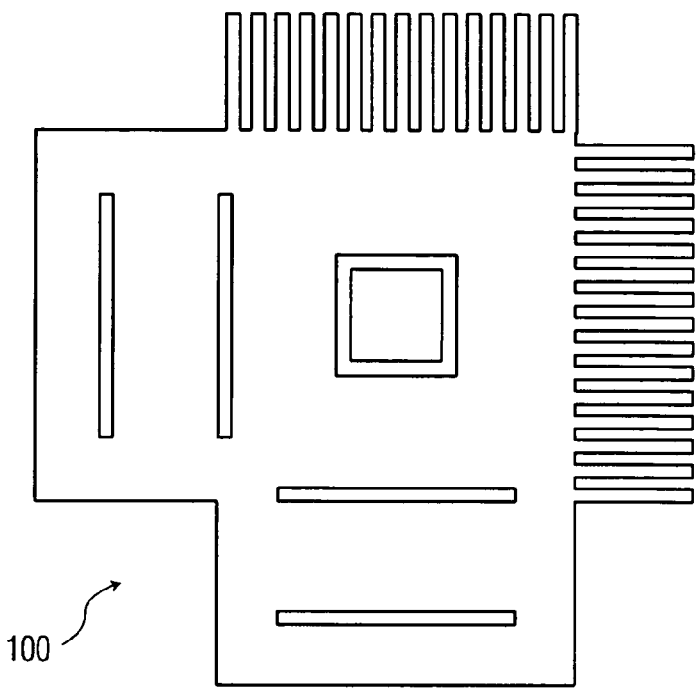
FIG. 1 is a clear-field mask of the lithographic structures according to an embodiment of the present invention.
Figure 2:
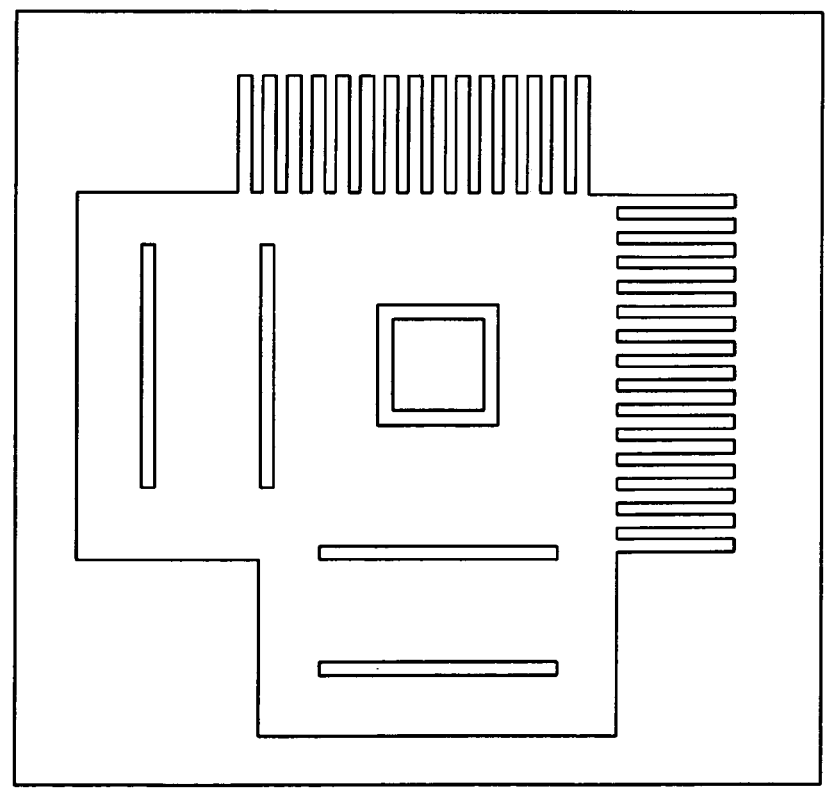
FIG. 2 is a dark-field mask of the lithographic structures depicted in FIG. 1.

Refer to FIG. 1 and FIG. 2. When the features of mask 100, 200, respectively are exposed nominally, the CDs of the features, as printed, equal that of the mask. If the coated wafer substrate is under or over exposed, the printed CDs deviate from those of the mask.

Figure 3:
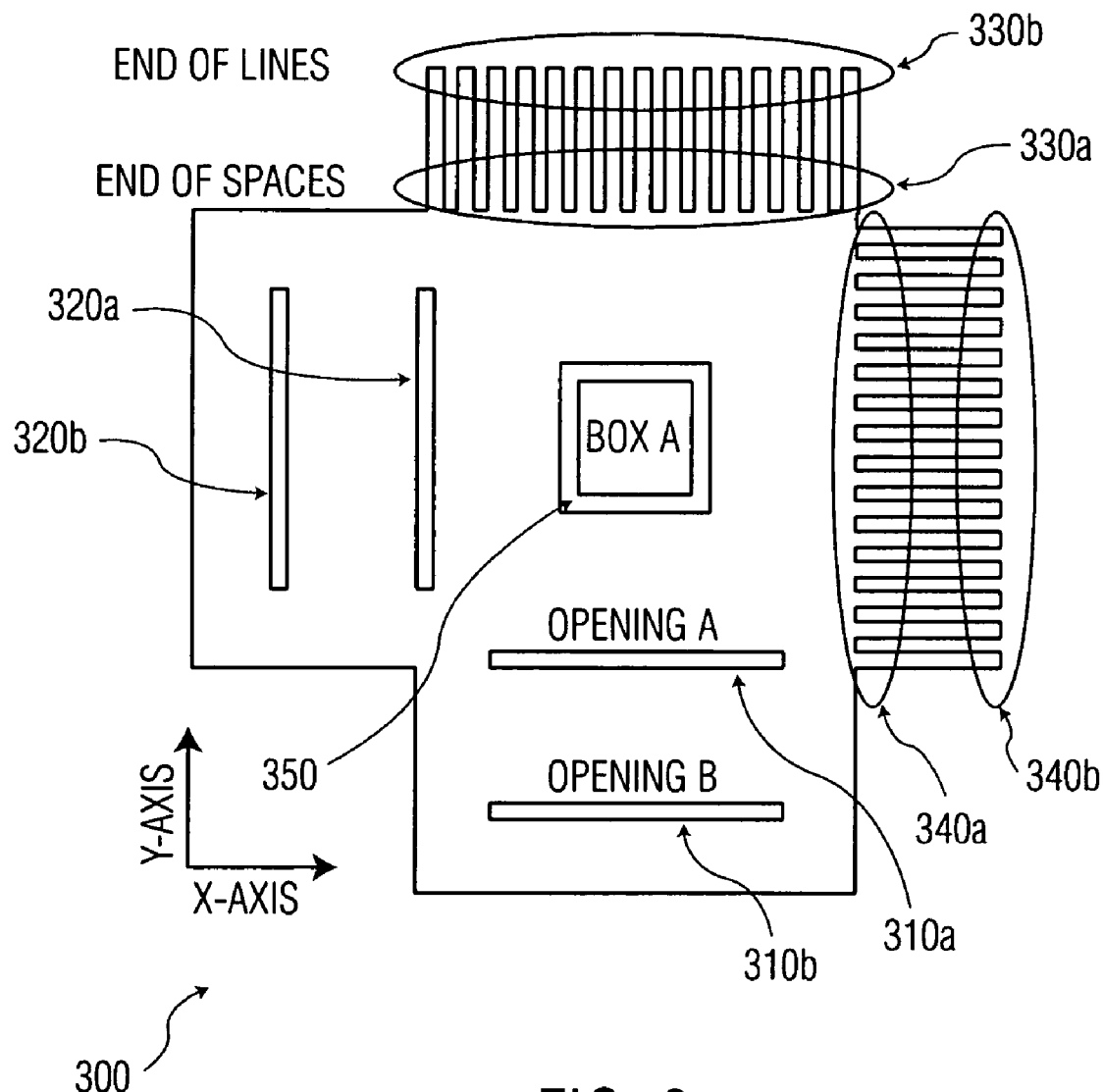
FIG. 3 illustrates the clear-field mask of FIG. 1 showing annotations thereon.

Refer to FIG. 3. Mask 300 depicts the features to be printed in accordance with the present invention. For the Y-axis direction, Openings A and B (310a, 310b) provide center references for an overlay measurement tool Box A (320) provides an additional reference for either of both directions. End of Spaces (330a) and End of Lines (330b) are the bottom part and top part, respectively. The structure may be used to measure the lengths of lines and spaces. In this figure the lines 330a, 330b, 340a 340b are equally spaced.

For the X-axis direction, there are corresponding Openings 320a and 320b and End of Spaces 340a and End of Lines 340b.

Figure 4:
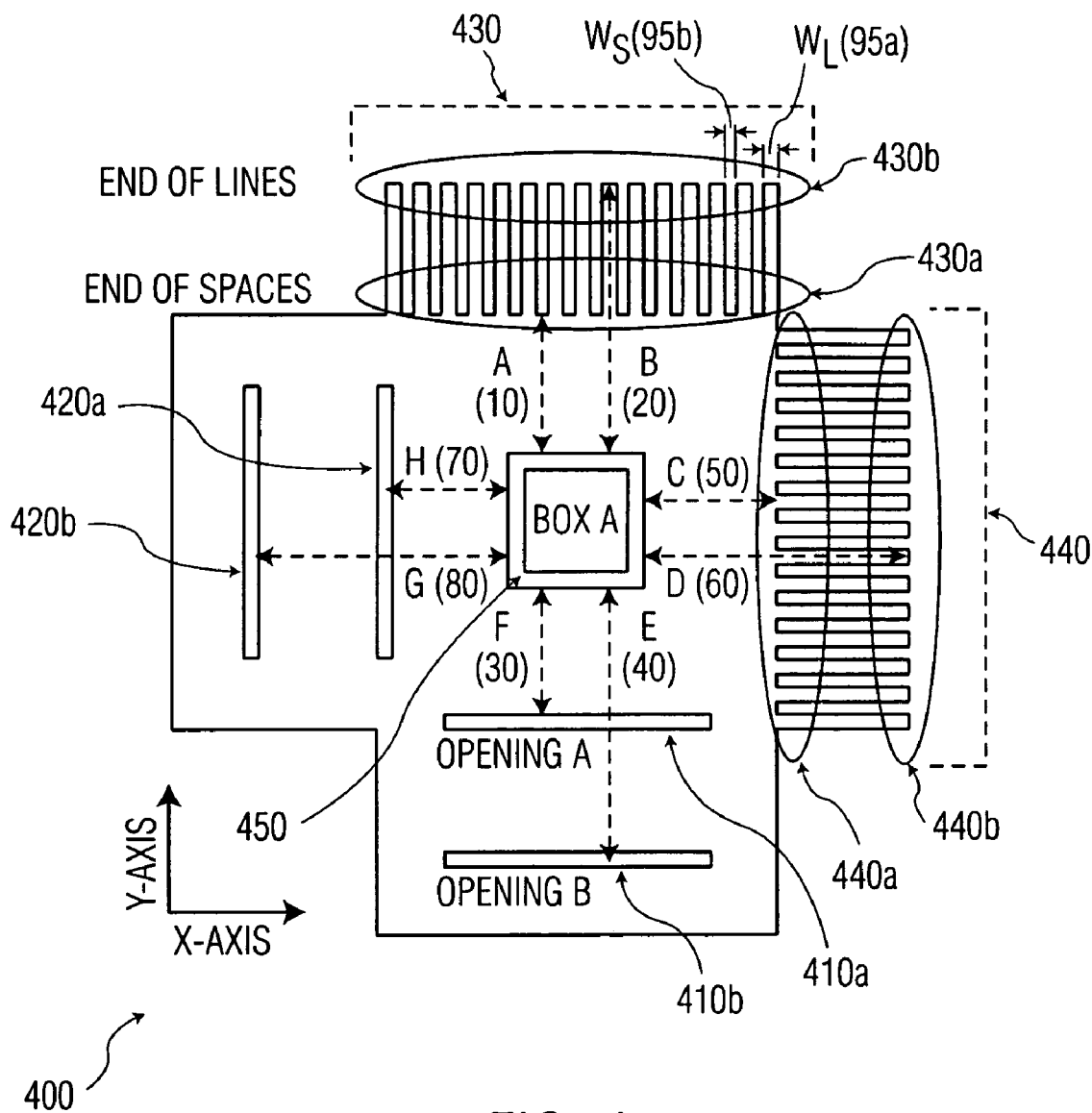
FIG. 4 illustrates certain measured dimensions in the X-direction and the Y-direction as the clear-field mask of FIG. 1 is used in an embodiment of the present invention.

FIG. 4. illustrates the reference photo lithographic structure of FIG. 3. For use in the Y-direction, the structure includes openings 410a, 410b and lines and spaces 430a, 430b respectively. For use in the X-direction, the structure includes openings 420a, 420b, and lines and spaces 440a, 440b, respectively. Box A—surrounded by a frame (450) is used as a reference for either direction. At the mask level, a distance "A" (10) between the top frame of Box A (450) and the end of spaces 430a is the same as a distance "F" (30), between the bottom frame of Box A (420) and the Opening A (410a). Also, the distance "B" (20) between top frame of Box A (450) and the end of lines 430b is the same at the distance "E" (40) between bottom of Box A (450) and Opening B (410b). A user can set up an overlay measurement job so that the tool catches the center, inner edge, or outer edge of the frame (450). The particular choice of reference depends upon process parameters and empirical observations. For a given situation, however, one reference edge of the frame (450) is selected and the same reference edge is used throughout the analysis. A pair of additional dimension arrows $W_L$ (95a) and $W_S$ (95b) depict the line width and space width of reference pattern 430, respectively. Although frame (450) is a square, it is possible use any regular polygon of four or more sides, in place of the square.

In examining the exposure in the Y-direction, when the photolithographic structure is over-exposed or under-exposed, the ends of lines (430b, 440b) and the ends of spaces (430a, 440a) are affected more than Openings A (410a) and B (410b). Because Openings A (410a) and B (410b) are on the order (i.e., approximately the same dimensions) of the size of lines (10, 20) and spaces and are horizontal, an overlay tool catches the center of the openings at the original locations, as was designed on the mask.

In the under-exposed case of pattern 500 (refer to FIG. 5A), lines 520 would be longer and wider than the designed length and width of 510 and spaces 540 would be shorter and narrower than the designed length and width of 510. Refer back to FIG. 4. Because of this effect, when an overlay tool compares the distances A (10) and F (30) in FIG. 4, A (10) would be longer than F (30). The distance F (30) would be the designed length because of the reason explained above. The length of spaces at the exposure can be calculated by adding the difference between A (10) and F (30) from the designed length of space (i.e., A (10)), one could calculate the length of space at the exposure used. Similarly, when the distances B (20) and E (40) are compared, B (20) would be longer than E (40) as well because E (40) stays at the designed length. The length of lines at the exposure can be calculated by adding the difference between B (20) and E (40) to the designed length of lines (i.e., E (40)). The degree that a pattern 500 is underexposed can be determined by adding the two differences [the difference of A (10) and F (30) and the difference of B (20) and E (40)] and dividing sum of the two differences by two would give by how much the structure is under-exposed. Referring to FIG. 6A, an underexposed pattern 600, illustrating the region of openings A and B of FIG. 4, includes an opening 630, which is smaller than the designed opening 610. The overlay tool recognizes the center of the opening at 610 (as defined by the dashed center line 605).

Similarly, in the X-direction, when the photolithographic structure is over-exposed or under-exposed, the ends of lines and the ends of spaces are affected more than Openings 420a and 420b Because Openings A and B are on the order of the size of lines and spaces and are vertical, an overlay tool catches the center of the openings at the original locations, as was designed on the mask. By a similar approach, in the X-direction, in the under-exposed case of pattern 500, when the overlay tool compares the distances C (50) and H (70) in FIG. 4, C (50) would be longer than H (70). The distance H (70) would be the designed length because of the reason explained above. In this case, by subtracting the difference between C (50) and H (70) from the designed length of space, one could calculate the length of space at the exposure used. With the same concept, when the distances D (60) and G (80) are compared, D (60) would be longer than G (80) as well because G (80) stays at the designed length. The length of lines at the exposure can be calculated by adding the difference between D (60) and G (80) to the designed length of lines. By adding two differences [the difference of C (50) and F (30) and the difference of D (60) and G (80)] and dividing sum of the two differences by two would give by how much the structure is under-exposed.

In the over-exposed case of pattern 500' (refer to FIG. 5B), lines 520 would be shorter and narrower than the designed length and width of 510' and spaces 530' would be longer and wider than the designed length and width of 510'. Using the same concept as the under-exposed case, for the Y-direction, adding the difference between F (30) and A (10) or for the X-direction adding the difference between H (70) and C (50) to the designed length of space would be the length of spaces at the exposure used. For the Y-direction, the difference between E (40) and B (20) is subtracted from the original length to get the length of lines at the exposure. For the X-direction, the difference between G (80) and D (60) is subtracted from the original length to get the length of lines at the exposure. Referring to FIG. 6B, in structure 600', the printed opening 630' is larger than the designed opening 610'. The overlay tool will recognize the center of the opening at 610 (as defined by the dashed center line)

In both cases, when the difference between A (10) and F (30) [or C (50) and H (70)] is equal to the difference between B (20) and E (40) [or D (60) and G (80)], that would tell us that both lines and spaces are under- or over-exposed by the same amount.

In the measurements described above, one must consider the equipment error by an overlay measurement tool. Because of lines and spaces, an overlay measurement tool may not properly recognize the edge at the desired location. Concurrently filed application titled, "Overlay Box Structure for Measuring Process Induced Line Shortening Effect (Ser. No. 10/841,147) of Yuji Yamaguchi and Pierre Leroux, assigned to Koninklijke Philips Electronics N.V. relates to the measuring of lengths of lines and spaces on widths through lithographic structures and enables the user to calculate the degree of equipment error as measurements are taken.

Figure 5A:
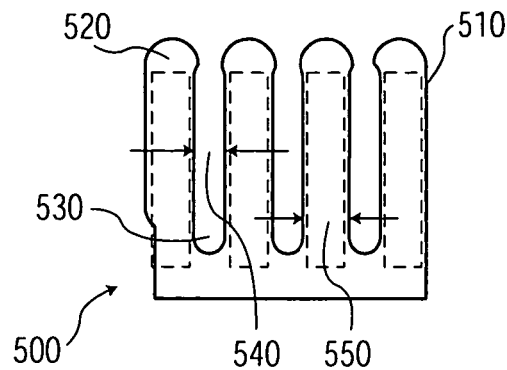
FIG. 5A depicts an under-exposed photo resist image of lines/spaces.
Figure 5B:
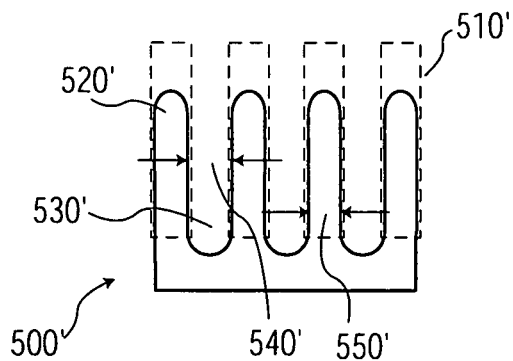
FIG. 5B depicts an over-exposed photo resist image of lines/spaces.
Figure 6A:
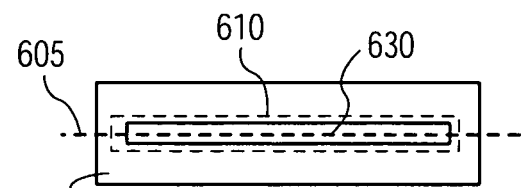
FIG. 6A depicts an under exposed photo resist image of an opening.
Figure 6B:
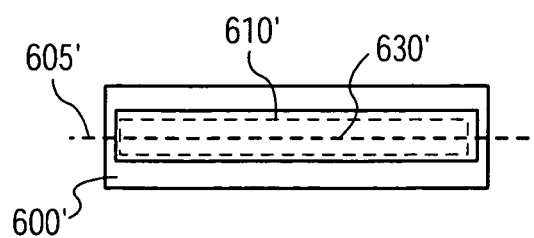
FIG. 6B depicts an over exposed photo resist image of an opening.

Refer to FIGS. 5A and 5B. Pattern 500 of FIG. 5A shows under-exposed features 520' printed by the mask as defined by dashed lines 510'. The printed features of lines 520' and spaces 530' show line widths larger than the mask dimensions. Correspondingly, the spaces 530 are smaller between the lines 520'. In the under-exposed case of FIG. 5A, lines would be longer than the designed length and spaces would be shorter than the designed length. Because of this effect, when an overlay measurement tool compares the distances "A" and "F" (refer to FIG. 4)), A would be longer than F. The distance F is the designed length because of the lack of the line shortening effect upon the overlay measurement between the Opening A (410a) and the frame 450. The distance F would be the designed length because both box A and opening A are created by frames. These frames are created by feature edges much larger than the CDs of the printed pattern and they provide a reference for the overlay measurement. The overlay measurement tool would catch the center of the frames, which means that the distances E, F, G, and H would be the same lengths as the mask dimensions.

Refer to FIG. 5A. Structure 500 of FIG. 5A shows underexposed features printed by the mask 510 (as defined by dashed lines). The printed features of lines 520 and spaces 530 show line lengths and widths larger than the mask 510 dimensions. The spaces 530 are shorter and narrower between the lines 520. Dimension arrows 540 depict the space width while dimension arrows 550 depict the line width of exposed features.

Refer to FIG. 5B. Structure 500' of FIG. 5B shows overexposed features printed by the mask 510' (as defined by dashed lines). The printed features of lines 520' and spaces 530' show line lengths and widths smaller than the mask 510' dimensions. Correspondingly, the spaces 530' are longer and wider between the lines 520'. Dimension arrows 540' depict the space width while dimension arrows 550' depict the line width.

Refer to FIGS. 6A and 6B. The structure 600 of FIG. 6A shows the opening 630 under-exposed while the same structure 600' of FIG. 6B has its opening 630' over-exposed. The dashed line 605 of FIG. 6A and dashed line of 605' of FIG. 6B is where the overlay tool reads the centers of the openings at the designed locations. The mask 610 (or 610') is shown as a rectangle of dashed lines.

There are a number of applications that may make use of the structure according to the present invention.

In an embodiment according to the present invention exposure may be varied without changing the widths of lines and spaces. By exposing the structure with different exposure doses and not changing the widths of lines and spaces, one could determine the exposure dose to print the same length for lines and spaces. If some amount of difference in length of lines and length of spaces is required, this technique can be used as well. One can plot a "Length vs. Exposure" for both lines and spaces, using data gathered by this technique. The lengths of lines and spaces are the same at an exposure where the data for lines and the data for spaces intersect in the plot as further described below. This technique is useful during qualification of a new process or photo resist.

During wafer fabrication, significant quantities of photo resist can be consumed. Although, a photo resist is manufactured to extreme tolerances of viscosity, exposure speed, particulate count, applied thickness for optimal coverage and edge definition, etc. there will be variations among different batches of resist. For example, one batch of twelve bottles of a particular grade resist may be desired. However, more than twelve bottles for a given production run (often the production is continuous) may be required. A different batch of the same grade resist is needed. To assure that the CDs of a given device print faithfully from batch-to-batch of photo resist, the technique previously can be employed. The invention provides rapidl determination of whether a new batch of resist has exposure characteristics that are essentially the same as the previous batch.

Figure 7:
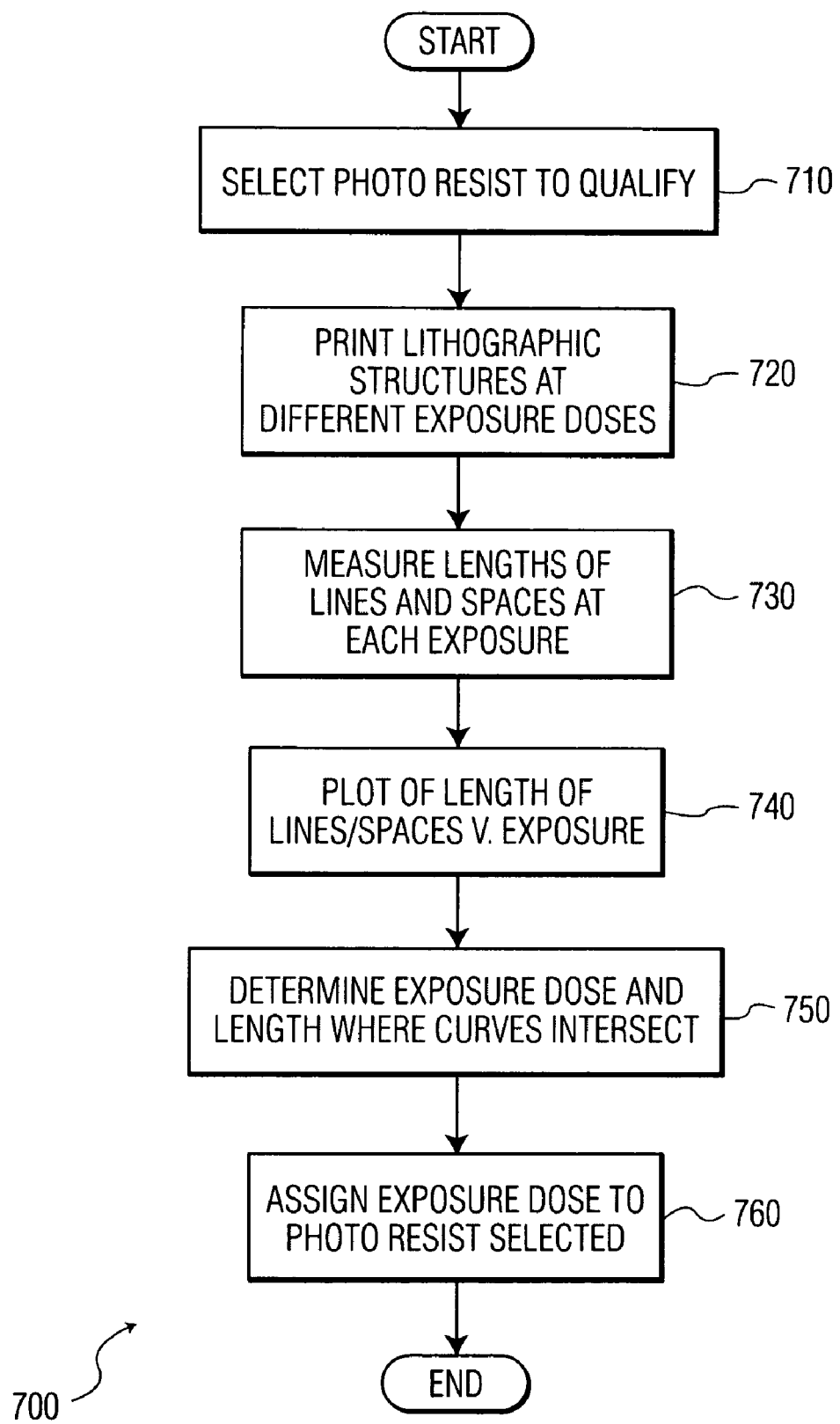
FIG. 7 is flowchart of a method for assigning an exposure does to a selected batch of photo resist.

Refer to FIG. 7. In accordance with embodiment of the present invention, the procedure 700 may be followed. A first batch of resist is selected to qualify 710. Lithographic structures (such as those depicted in FIG. 1) are printed on a substrate at different exposure doses 720. The exposed substrate is developed. The lengths of lines and spaces at each exposure dose are measured 730. A plot of the lines/spaces versus exposure is generated 740. The user determines the exposure dose where the plots of "Line Length v. Exposure Dose" and "Space Length v. Exposure Dose" intersect 750. Thus, for a given photo resist batch, an expected exposure dose that produces lines and spaces equal in length is assigned 760.

Figure 8A:
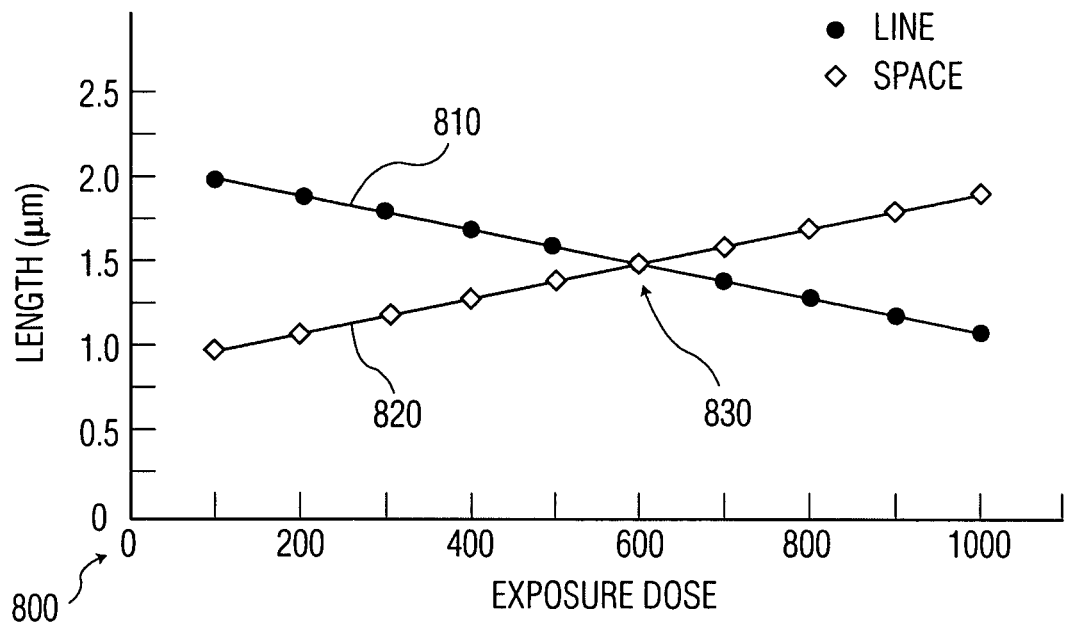
FIG. 8A illustrates-a plot of length v. exposure dose.

Refer to FIG. 8a. Plot 800 comprises a first plot of measured line length versus exposure dose 810 and a second plot of measure space length versus exposure dose 820. At the intersection 730 of the first curve and the second curve is the exposure dose where the length of the line and space are equal. Thus, for an example batch of photo resist, an exposure dose of 600 renders lines and spaces of about 1.51 μm for a lithographic pattern have equally dimensioned lines and spaces, such as shown in FIG. 1. However, the user is not necessarily limited to using a pattern having equally dimensioned lines and spaces.

In yet another embodiment of the present invention the widths of lines and spaces may be varied without changing exposure. In a similar process as outlined in FIG. 7, by creating the structures with different combinations of width of lines and that of spaces and exposing them with the same exposure, one could determine the best width combination to print the same lengths of lines and spaces. If some amount of difference in length of lines and length of spaces is required, this technique can be used as well. Refer back FIG. 4. Dimension arrows $W_L$ (95a) and $W_S$ (95b) depict the line width and space width, respectively. The user may adjust these dimensions depending upon his or her requirements.

Special circumstances may encourage the use of a lithographic pattern having unequal line and space dimensions. For example, space dimensions may be defined in a ratio to line dimensions. In one example embodiment, spaces may be defined at dimensions one-half of those of the lines or vice-versa. In an example process of application specific integrated circuits (ASICs) having embedded memory, such a characterization may enhance the yield in that the memory portion has particular process requirements while the logic portions and input/output (IO) has others. Critical CDs of each portion may be optimized so as to make an effective compromise between performance and yield of each ASIC portion. Table 1 depicts example data for a lithographic pattern having unequal line and space dimensions shot at a particular exposure dose. These data may be plotted to determine which combination of widths of lines/spaces result in equal lengths of lines and spaces.

Figure 8B:
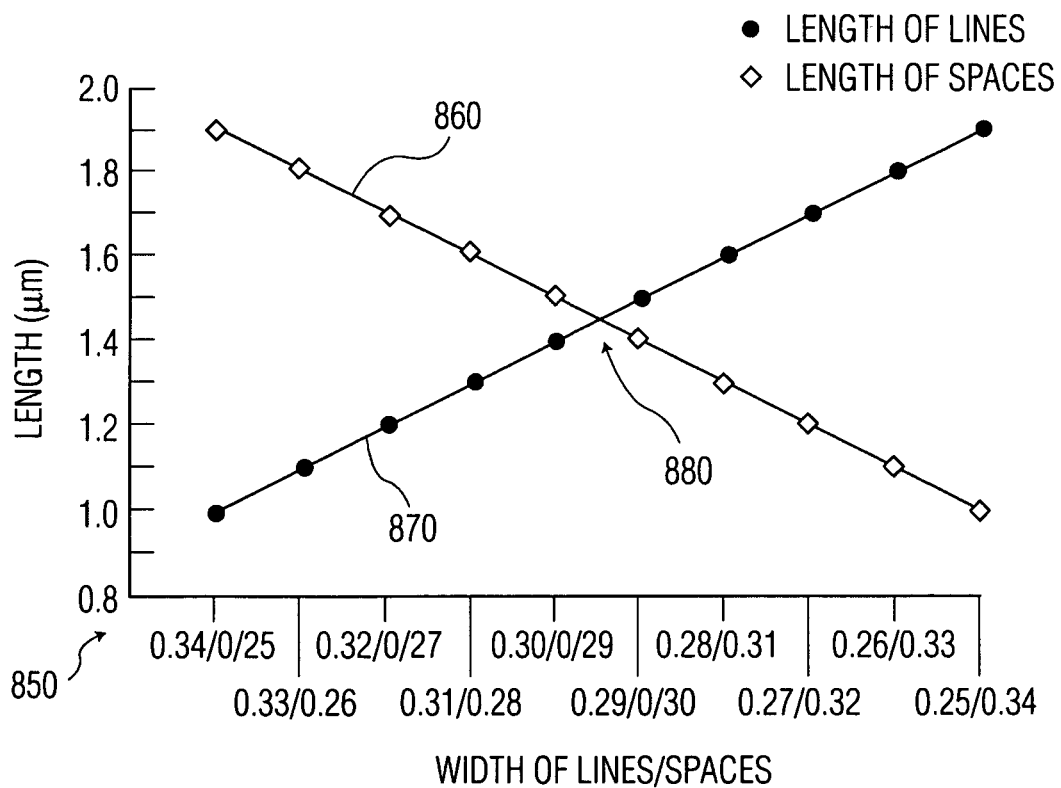
FIG. 8B illustrates a plot length v. width of lines/spaces.

Refer to FIG. 8b. Plot 850 comprises a first plot of measured space length versus width of lines/spaces 860 and a second plot of measure line length versus width of lines/spaces 870. At the intersection 880 of the first curve and the second curve is the width of line/space where the length of the line and space features are equal. An example of the width of line and spaces may be seen in FIGS. 5A and 5B, dimension arrows 540 depicts the space width while dimension arrows 550 depict the line width.

TABLE 1

Lithographic Pattern with Unequal Line and Space Dimensions

| Width of Lines/Spaces | Length of Lines | Length of Spaces |
|---|---|---|
| 0.34/0.25 | 1.0 | 1.9 |
| 0.33/0.26 | 1.1 | 1.8 |
| 0.32/0.27 | 1.2 | 1.7 |
| 0.31/0.28 | 1.3 | 1.6 |

TABLE 1-continued

Lithographic Pattern with Unequal Line and Space Dimensions

| Width of Lines/Spaces | Length of Lines | Length of Spaces |
|---|---|---|
| 0.30/0.29 | 1.4 | 1.5 |
| 0.29/0.30 | 1.5 | 1.4 |
| 0.28/0.31 | 1.6 | 1.3 |
| 0.27/0.32 | 1.7 | 1.2 |
| 0.26/0.33 | 1.8 | 1.1 |
| 0.25/0.34 | 1.9 | 1.0 |

In yet another embodiment of the present invention, a structure with different degrees of optical proximity correction (OPC) and exposing at different exposures, one may verify the precision of optical proximity correction (OPC) in the sense of understanding difference in lengths of lines and spaces. The procedure depicted in FIG. 7 may be modified to perform such a study. Further information may be found in U.S. Pat. No. 5,902,703 titled, "Method for Measuring the Effectiveness of Optical Proximity Corrections," U.S. Pat. No. 5,962,173 titled, "Arrangement and Method for Calibrating Optical Line Shortening Measurement," and U.S. Pat. No. 6,301,008 titled, "Method for Measuring Dimensional Anomalies in Photolithographed Integrated Circuits Using Overlay Metrology, and Masks Therefor," cited earlier and are incorporated by reference in their entirety.

Figure 9:
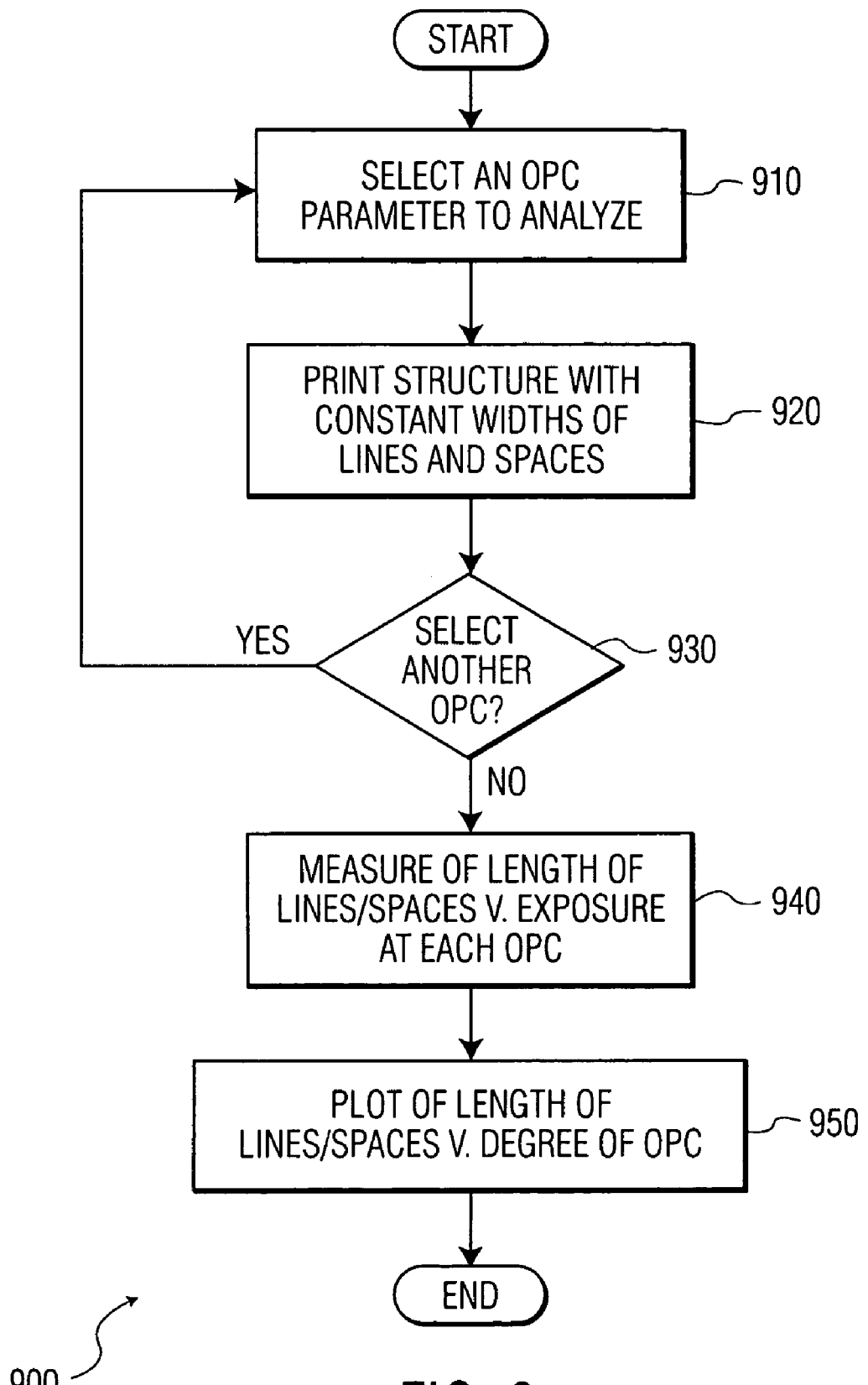
FIG. 9 is a flowchart of a method for plotting length of lines/spaces v. degree of optical proximity corrections.

Referring to FIG. 9, a particular optical proximity correction (OPC) parameter may be selected for analysis 910. A structure with constant widths of lines and spaces is printed 920. If another OPC parameter is to be selected 940, steps 910 and 920 may be repeated. Having completed step 930, the length of lines and spaces versus exposure are measured for each OPC 940. The length of lines and spaces versus degree of OPC is then plotted 950.

While the present invention has been described with reference to several particular example embodiments, those skilled in the art will recognize that many changes may be made thereto without departing from the spirit and scope of the present invention, which is set forth in the following claims.

The invention claimed is:

1. A lithographic structure for measuring dimensions of lines and spaces on a substrate, comprising:
a frame, the frame including a top inside edge, a top outside edge, a bottom inside edge, a bottom outside edge, a left inside edge, a left outside edge, a right inside edge, and a right outside edge;
a first array of lines and spaces, the first array having end of lines and end of spaces, the lines having a first line width, the spaces having a first space width, the end of spaces at a first distance from the top outside edge of the frame, the end of lines at a second distance from the top outside edge of the frame;
a first opening, the first opening a third distance from the bottom outside edge of the frame; and
a second opening, the second opening a fourth distance from the bottom outside edge of the frame.

2. The lithographic structure of claim 1 wherein the frame comprises a polygon having at least four sides.

3. The lithographic structure of claim 2 wherein the polygon comprises a box.

4. The lithographic structure of claim 1, wherein the line width of the lines and the space width of the spaces are about equal.

5. The lithographic structure of claim 1, wherein the line width of the lines and the space width of the spaces are not equal.

6. The lithographic structure of claim 1, wherein the line width of the lines and the space width of the spaces are sized to a process technology minimum critical dimension.

7. The lithographic structure of claim 1 wherein, the first distance is equal to the third distance); and the second distance is equal to the fourth distance.

8. The lithographic structure of claim 1, further comprising, a second array of lines and spaces, the second array having end of lines and end of spaces, the lines having a second line width, the spaces having a second space width, the end of spaces at a fifth distance from the right outside edge of the frame, the end of lines at a sixth distance from the right outside edge of the frame; a third opening, the third opening a seventh distance from the left outside edge of the frame; and a fourth opening, the fourth opening an eighth distance from the left outside edge of the frame.

9. The lithographic structure of claim 7, wherein the first line width of the lines, the first space width of the spaces, the second line width of the lines, and the second space width of the spaces are about equal.

10. The lithographic structure of claim 7, wherein the first line width of the lines, the first space width of the spaces, the second line width of the lines, and the second space width of the spaces are not equal.

11. The lithographic structure of claim 7, wherein the first line width of the lines, the first space width of the spaces, the second line width of the lines, and the second space width of the spaces are sized to a ratio of a process technology minimum critical dimension.

12. The lithographic structure of claim 7, wherein the first line width of the lines, the first space width of the spaces, the second line width of the lines, and the second space width of the spaces are sized to a process technology minimum critical dimension.

13. A lithographic structure for measuring dimensions of lines and spaces on a substrate, comprising:
a frame including, a top inside edge, a top outside edge, a bottom inside edge, a bottom outside edge, a left inside edge, a left outside edge, a right inside edge, and a right outside edge;
a first array of lines and spaces, the first array having end of lines and end of spaces, the lines having a first line width, the spaces having a first space width, the end of spaces at a first distance from the top outside edge of the frame, the end of lines at a second distance from the top outside edge of the frame;
a first opening having a first width, the first opening a third distance from the bottom outside edge of the frame;
a second opening having a second width the second opening a fourth distance from the bottom outside edge of the frame;
a second array of lines and spaces, the second array having end of lines and end of spaces, the lines having a second line width, the spaces having a second space width, the end of spaces at a fifth distance from the right outside edge of the frame, the end of lines at a sixth distance from the right outside edge of the frame;
a third opening, having a third width the third opening a seventh distance from the right outside edge of the frame; and
a fourth opening, having a fourth width the fourth opening a eighth distance from the right outside edge of the frame.

14. A method for measuring the exposure of a photolithographic image on a substrate, the method comprising:

forming an image on the substrate, the image comprising, a frame, including a top inside edge, a top outside edge, a bottom inside edge, a bottom outside edge, a left inside edge, a left outside edge, a right inside edge, and a right outside edge; a first array of lines and spaces, the first array having end of lines and end of spaces, the lines having a first line width, the spaces having a first space width, the end of spaces at a first distance from the top outside edge of the frame, the end of lines at a second distance from the top outside edge of the frame; a first opening, the first opening a third distance from the bottom outside edge of the frame; and a second opening, the second opening a fourth distance from the bottom outside edge of the frame;

measuring the first distance between the end of spaces and the top outside edge of the frame;

measuring the second distance between the end of lines and the top outside edge of the frame;

measuring the third distance between the bottom outside edge of the frame and the first opening;

measuring the fourth distance between the bottom outside edge of the frame and the second opening; and determining the exposure as a function of the first distance and the third distance and a function of the second distance and fourth distance.

15. The method of claim 14 wherein, determining the exposure further comprises, making a determination of exposure, wherein: under-exposure comprises the first distance being greater than the third distance and second distance being greater than the fourth distance; and over-exposure comprises the first distance being less than the third distance and second distance being less than the fourth distance.

16. A method for measuring the exposure of a photolithographic image on a substrate, the substrate having been coated with a photo resist, the method comprising:

developing the photo resist and forming an image on the substrate, the image comprising, a frame, including a top reference edge, a bottom reference edge, a left reference edge, a right reference edge; a first array of lines and spaces, the first array having end of lines and end of spaces, the lines having a first line width, the spaces having a first space width, the end of spaces at a first distance from the top reference edge of the frame, the end of lines at a second distance from the top reference edge of the frame; a first opening, the first opening a third distance from the bottom reference edge of the frame; and a second opening, the second opening a fourth distance from the reference outside edge of the frame;

measuring the first distance between the end of spaces and the top reference edge of the frame;

measuring the second distance between the end of lines and the top reference edge of the frame;

measuring the third distance between the bottom reference edge of the frame and the first opening;

measuring the fourth distance between the reference outside edge of the frame and the second opening; and determining the exposure as a function of the first distance and the third distance and a function of the second distance and fourth distance.

17. The method of claim 16 wherein, determining the exposure further comprises, taking a first difference of the first distance and the third distance; taking a second difference of the second distance and the fourth distance; and making a determination of under-exposure defined as, the first distance being greater than the third distance; and making a determination of over-exposure defined as, second distance being greater than the fourth distance.

18. The method of claim 16 wherein, a reference edge of the frame is selected from at least one of the following: an inside edge, an outside edge, in between the inside edge and the outside edge.

19. A method for qualifying a batch of photo resist, the method comprising: selecting a batch photo resist; printing lithographic structures at different exposure doses; measuring lengths of lines and spaces at each exposure dose; plot curves of length of lines and spaces versus exposure dose; determine the exposure dose and length lines and spaces where the curves intersect; and assigning exposure dose to the batch photo resist selected.

* * * * *